United States Patent
Koudele

(10) Patent No.: US 9,437,316 B2
(45) Date of Patent: *Sep. 6, 2016

(54) CONTINUOUS ADJUSTING OF SENSING VOLTAGES

(71) Applicant: Micron Technology, Inc., Boise, ID (US)

(72) Inventor: Larry J. Koudele, Erie, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/844,722

(22) Filed: Sep. 3, 2015

(65) Prior Publication Data

US 2015/0380098 A1 Dec. 31, 2015

Related U.S. Application Data

(63) Continuation of application No. 14/018,938, filed on Sep. 5, 2013, now Pat. No. 9,147,486.

(51) Int. Cl.
| | |
|---|---|
| *G11C 16/04* | (2006.01) |
| *G11C 16/26* | (2006.01) |
| *G11C 16/28* | (2006.01) |
| *G11C 11/56* | (2006.01) |
| *G11C 5/14* | (2006.01) |
| *G11C 29/02* | (2006.01) |

(52) U.S. Cl.
CPC .............. *G11C 16/26* (2013.01); *G11C 5/14* (2013.01); *G11C 11/5628* (2013.01); *G11C 16/0483* (2013.01); *G11C 16/28* (2013.01); *G11C 29/021* (2013.01); *G11C 29/028* (2013.01)

(58) Field of Classification Search
CPC ....... G11C 16/10; G11C 29/82; G11C 16/04; G11C 2216/16; G11C 2216/18; G11C 8/12; G11C 16/3404; G11C 16/3418; G11C 16/3495
USPC ....................................... 365/185.11, 185.09
See application file for complete search history.

(56) References Cited

U.S. PATENT DOCUMENTS

| | | | |
|---|---|---|---|
| 7,817,467 B2 | 10/2010 | Roohparvar et al. | |
| 7,900,102 B2 | 3/2011 | Sokolov et al. | |
| 8,077,515 B2 | 12/2011 | Shen et al. | |
| 8,159,874 B2 | 4/2012 | Roohparvar | |
| 9,147,486 B2 * | 9/2015 | Koudele | ................ G11C 16/28 |
| 2009/0185415 A1 | 7/2009 | Roohparvar | |
| 2011/0075478 A1 | 3/2011 | Yoon et al. | |
| 2012/0240011 A1 | 9/2012 | Helm et al. | |
| 2013/0166972 A1 | 6/2013 | Seabury et al. | |
| 2013/0346812 A1 | 12/2013 | Bahirat et al. | |

* cited by examiner

*Primary Examiner* — Huan Hoang

(74) *Attorney, Agent, or Firm* — Brooks, Cameron & Huebsch, PLLC

(57) ABSTRACT

The present disclosure includes apparatuses and methods for continuous adjusting of sensing voltages. A number of embodiments include continuously monitoring an error rate associated with sense operations performed on a group of memory cells, and continuously adjusting a sensing voltage used to determine a state of the memory cells of the group based, at least partially, on the error rate.

17 Claims, 5 Drawing Sheets

CONTINUOUS ADJUSTING OF SENSING VOLTAGES

PRIORITY INFORMATION

This application is a Continuation of U.S. application Ser. No. 14/018,938 filed Sep. 5, 2013, the specification of which is incorporated herein by reference.

TECHNICAL FIELD

The present disclosure relates generally to semiconductor memory and methods, and more particularly, to continuous adjusting of sensing voltages.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can retain stored data when not powered and can include NAND flash memory, NOR flash memory, phase change random access memory (PCRAM), resistive random access memory (RRAM), and magnetic random access memory (MRAM), among others.

Memory devices can be combined together to form a solid state drive (SSD). An SSD can include non-volatile memory (e.g., NAND flash memory and/or NOR flash memory), and/or can include volatile memory (e.g., DRAM and/or SRAM), among various other types of non-volatile and volatile memory. Flash memory devices can include memory cells storing data in a charge storage structure such as a floating gate, for instance, and may be utilized as non-volatile memory for a wide range of electronic applications. Flash memory devices typically use a one-transistor memory cell that allows for high memory densities, high reliability, and low power consumption.

Memory cells in an array architecture can be programmed to a target (e.g., desired) state. For instance, electric charge can be placed on or removed from the charge storage structure (e.g., floating gate) of a memory cell to program the cell to a particular data state. The stored charge on the charge storage structure of the memory cell can indicate a threshold voltage (Vt) of the cell.

For example, a single level cell (SLC) can be programmed to a targeted one of two different data states, which can be represented by the binary units 1 or 0. Some flash memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

A state of a flash memory cell can be determined by sensing the stored charge on the charge storage structure (e.g., the Vt) of the cell. For example, sense operations (e.g., read and/or program verify operations) can use sensing voltages to sense the Vt of flash memory cells and thereby determine the state of the cells. However, a number of mechanisms, such as read disturb, program disturb, and/or charge loss (e.g., charge leakage), can cause the Vt of the memory cells to change. As a result of the change in the Vt, previously used sensing voltages (e.g., sensing voltages used prior to when the change in the Vt occurs) may no longer provide accurate and/or reliable sensing of the memory cells. That is, previously used sensing voltages may result in an erroneous sensing of the memory cells when used during subsequent sense operations. For example, the use of previous sensing voltages may result in a determination that the memory cells are in a state other than the target state (e.g., a state different than the target state to which the cell was programmed).

DETAILED DESCRIPTION

Figure 1:
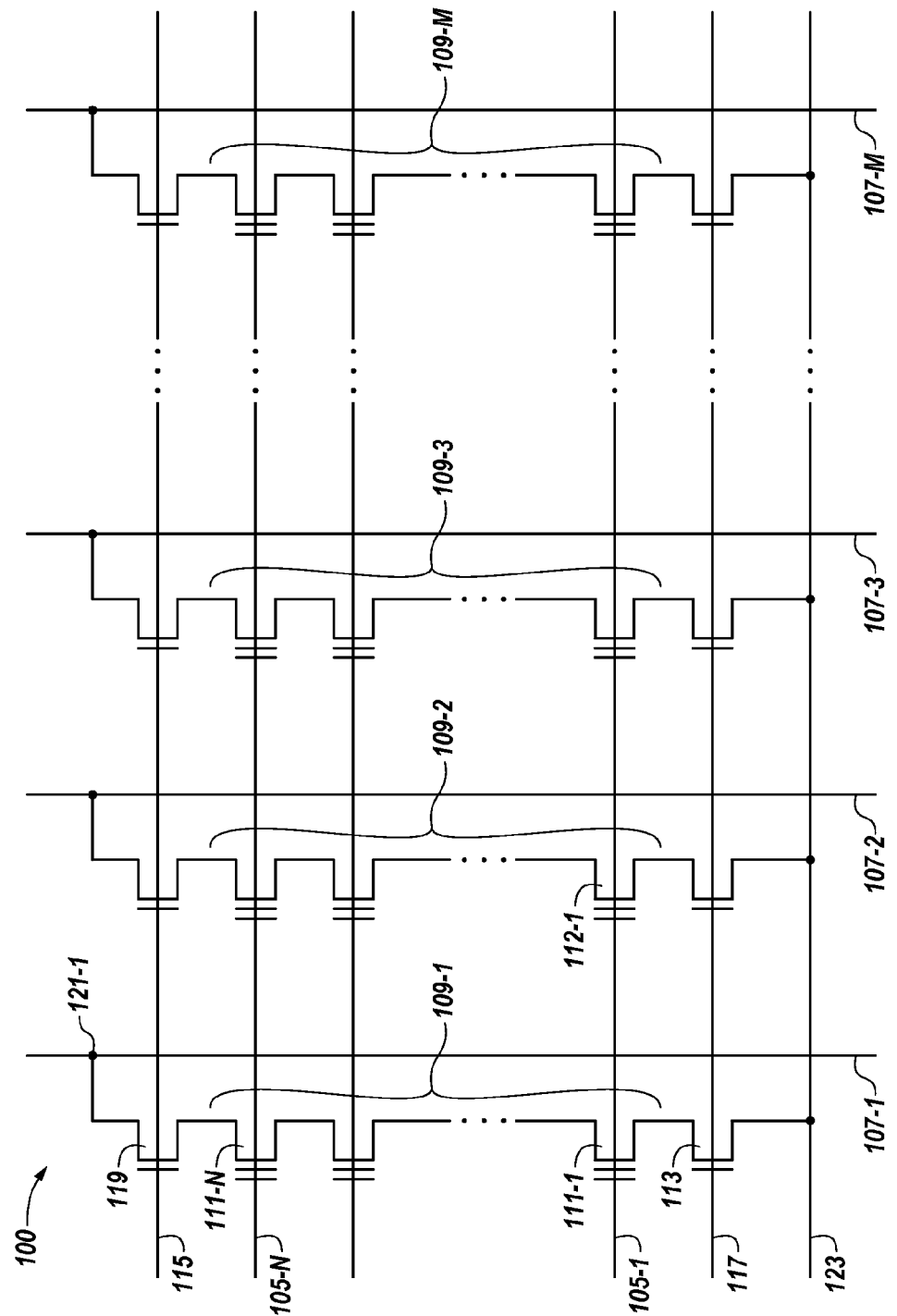
FIG. 1 illustrates a schematic diagram of a portion of a non-volatile memory array in accordance with a number of embodiments of the present disclosure.

The present disclosure includes apparatuses and methods for continuous adjusting of sensing voltages. A number of embodiments include continuously monitoring an error rate associated with sense operations performed on a group of memory cells, and continuously adjusting a sensing voltage used to determine a state of the memory cells of the group based, at least partially, on the error rate.

Tracking and/or compensating for threshold voltage (Vt) change in memory can provide benefits such as increased accuracy and/or reliability (e.g., decreased error rate), and/or increased memory life, among other benefits. Embodiments of the present disclosure can track and/or compensate for Vt change in memory by continuously calibrating sensing voltages used to determine the state of the memory. For example, embodiments of the present disclosure can utilize sense operations already being performed on the memory (e.g., already occurring) during operation of the memory (e.g., sense operations initiated by the user of the memory) to continuously calibrate the sensing voltages used to determine the state of the memory. Accordingly, embodiments of the present disclosure can track and/or compensate for Vt change in the memory without negatively affecting the performance (e.g., speed, reliability, and/or power consumption) of the memory.

In contrast, previous approaches for tracking and/or compensating for Vt change in memory may utilize dedicated calibration events (e.g., calls and/or reads) that are separate from and/or in addition to the operations (e.g., sense operations) already being performed on the memory to calibrate the sensing voltages used to determine the state of the memory. Accordingly, such previous approaches may negatively affect the performance of the memory. For example, such dedicated calibration events can be time consuming and/or cause glitches in the performance of the memory.

As used herein, "a number of" something can refer to one or more such things. For example, a number of memory cells can refer to one or more memory cells. Additionally, the designators "M" "N", "R", "S", and "B", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 200 in FIG. 2.

FIG. 1 illustrates a schematic diagram of a portion of a non-volatile memory array 100 in accordance with a number of embodiments of the present disclosure. The embodiment of FIG. 1 illustrates a NAND architecture non-volatile memory array. However, embodiments described herein are not limited to this example. As shown in FIG. 1, memory array 100 includes access lines (e.g., word lines 105-1, . . . , 105-N) and intersecting data lines (e.g., local bit lines) 107-1, 107-2, 107-3, . . . , 107-M. For ease of addressing in the digital environment, the number of word lines 105-1, . . . , 105-N and the number of local bit lines 107-1, 107-2, 107-3, . . . , 107-M can be some power of two (e.g., 256 word lines by 4,096 bit lines).

Memory array 100 includes NAND strings 109-1, 109-2, 109-3, . . . , 109-M. Each NAND string includes non-volatile memory cells 111-1, . . . , 111-N, each communicatively coupled to a respective word line 105-1, . . . , 105-N. Each NAND string (and its constituent memory cells) is also associated with a local bit line 107-1, 107-2, 107-3, . . . , 107-M. The non-volatile memory cells 111-1, . . . , 111-N of each NAND string 109-1, 109-2, 109-3, . . . , 109-M are connected in series source to drain between a source select gate (SGS) (e.g., a field-effect transistor (FET)) 113, and a drain select gate (SGD) (e.g., FET) 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N (e.g., a floating-gate transistor) of the corresponding NAND string 109-1.

In a number of embodiments, construction of non-volatile memory cells 111-1, . . . , 111-N includes a charge storage structure such as a floating gate, and a control gate. Non-volatile memory cells 111-1, . . . , 111-N have their control gates coupled to a word line, 105-1, . . . , 105-N respectively. A "column" of the non-volatile memory cells, 111-1, . . . , 111-N, make up the NAND strings 109-1, 109-2, 109-3, . . . , 109-M, and are coupled to a given local bit line 107-1, 107-2, 107-3, . . . , 107-M, respectively. A "row" of the non-volatile memory cells are those memory cells commonly coupled to a given word line 105-1, . . . , 105-N. The use of the terms "column" and "row" is not meant to imply a particular linear (e.g., vertical and/or horizontal) orientation of the non-volatile memory cells. A NOR array architecture would be similarly laid out, except that the string of memory cells would be coupled in parallel between the select gates.

As will be further described herein, subsets of cells coupled to a selected word line (e.g., 105-1, . . . , 105-N) can be programmed and/or sensed (e.g., read) together (e.g., at the same time). A program operation (e.g., a write operation) can include applying a number of program pulses (e.g., 16V-20V) to a selected word line in order to increase the threshold voltage (Vt) of selected cells coupled to that selected access line to a desired program voltage level corresponding to a target (e.g., desired) data state.

A sense operation, such as a read or program verify operation, can include sensing a voltage and/or current change of a bit line coupled to a selected cell in order to determine the data state of the selected cell. The sense operation can include providing a voltage to (e.g., biasing) a bit line (e.g., bit line 107-1) associated with a selected memory cell above a voltage (e.g., bias voltage) provided to a source line (e.g., source line 123) associated with the selected memory cell. A sense operation could alternatively include precharging the bit line followed with discharge when a selected cell begins to conduct, and sensing the discharge.

Sensing the state of a selected cell can include providing a number of ramped sensing signals (e.g., read voltages) to a selected word line while providing a number of pass signals (e.g., read pass voltages) to the word lines coupled to the unselected cells of the string sufficient to place the unselected cells in a conducting state independent of the Vt of the unselected cells. The bit line corresponding to the selected cell being read and/or verified can be sensed to determine whether or not the selected cell conducts in response to the particular sensing voltage applied to the selected word line. For example, the data state of a selected cell can be determined by the word line voltage at which the bit line current reaches a particular reference current associated with a particular state.

As one of ordinary skill in the art will appreciate, in a sense operation performed on a selected memory cell in a NAND string, the unselected memory cells of the string are biased so as to be in a conducting state. In such a sense operation, the data state of the selected cell can be determined based on the current and/or voltage sensed on the bit line corresponding to the string. For instance, the data state of the selected cell can be determined based on whether the bit line current changes by a particular amount or reaches a particular level in a given time period.

When the selected cell is in a conductive state, current flows between the source line contact at one end of the string and a bit line contact at the other end of the string. As such, the current associated with sensing the selected cell is carried through each of the other cells in the string and the select transistors.

Figure 2:
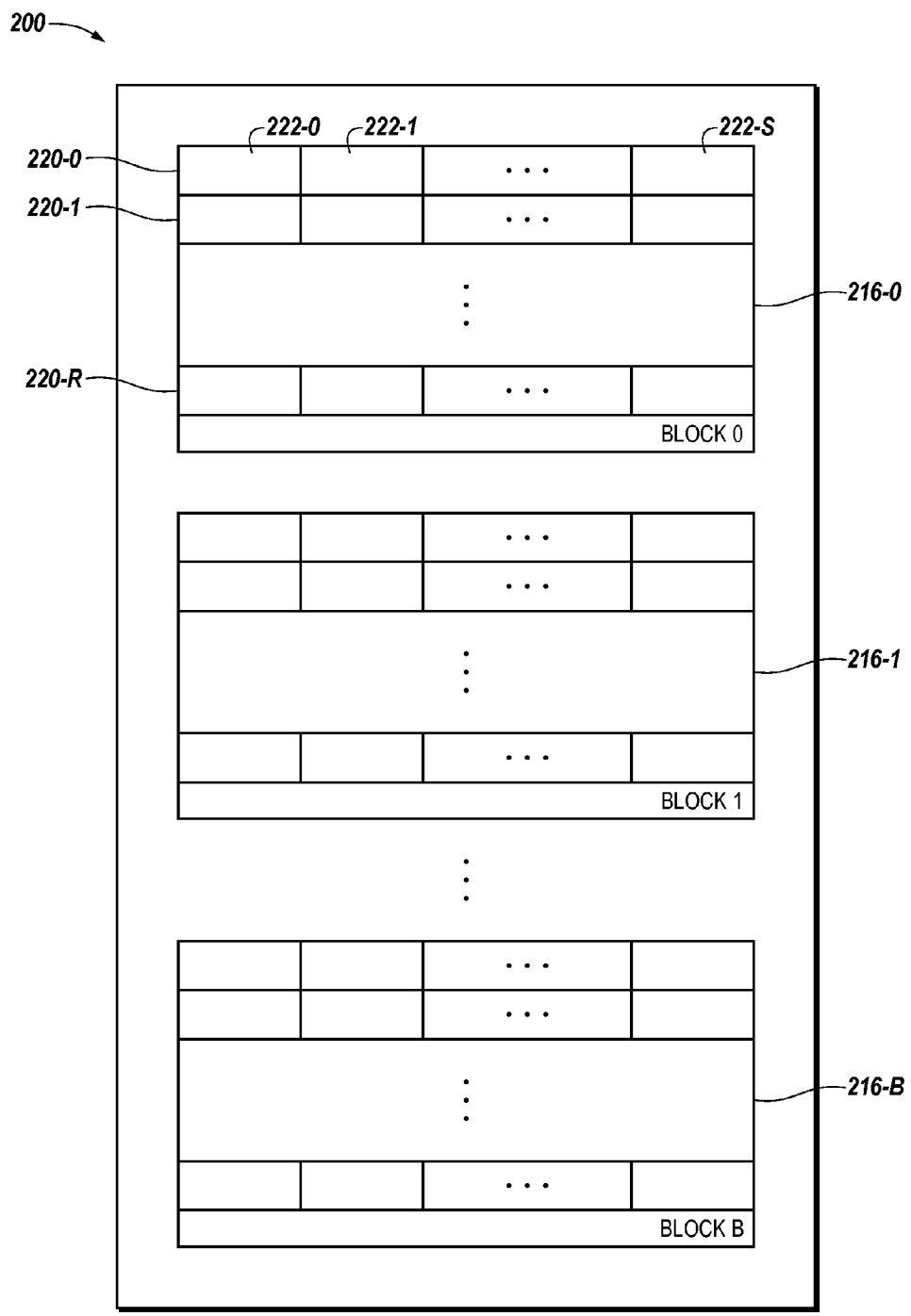
FIG. 2 illustrates a diagram of a portion of a memory array having a number of physical blocks in accordance with a number of embodiments of the present disclosure.

FIG. 2 illustrates a diagram of a portion of a memory array 200 having a number of physical blocks in accordance with a number of embodiments of the present disclosure. Memory array 200 can be, for example, memory array 100 previously described in connection with FIG. 1.

As shown in FIG. 2, memory array 200 has a number of physical blocks 216-0 (BLOCK 0), 216-1 (BLOCK 1), . . . , 216-B (BLOCK B) of memory cells. The memory cells can be single level cells and/or multilevel cells. As an example, the number of physical blocks in memory array 200 may be 128 blocks, 512 blocks, or 1,024 blocks, but embodiments are not limited to a particular multiple of 128 or to any particular number of physical blocks in memory array 200.

In the example shown in FIG. 2, each physical block 216-0, 216-1, . . . , 216-B includes memory cells which can be erased together as a unit (e.g., the cells in each physical block can be erased in a substantially simultaneous manner). For instance, the memory cells in each physical block can be erased together in a single erase operation.

A number of physical blocks of memory cells (e.g., blocks 216-0, 216-1, . . . , 216-B) can be included in a plane of memory cells, and a number of planes of memory cells can be included on a die. For instance, in the example shown in FIG. 2, each physical block 216-0, 216-1, . . . , 216-B can be part of a single die. That is, the portion of memory array 200 illustrated in FIG. 2 can be die of memory cells.

As shown in FIG. 2, each physical block 216-0, 216-1, . . . , 216-B contains a number of physical rows (e.g., 220-0, 220-1, . . . , 220-R) of memory cells coupled to access lines (e.g., word lines). The number of rows (e.g., word lines) in each physical block can be 32, but embodiments are not limited to a particular number of rows 220-0, 220-1, . . . , 220-R per physical block.

As one of ordinary skill in the art will appreciate, each row 220-0, 220-1, . . . , 220-R can include a number of pages of memory cells (e.g., physical pages). A physical page refers to a unit of programming and/or sensing (e.g., a number of memory cells that are programmed and/or sensed together as a functional group). In the embodiment shown in FIG. 2, each row 220-0, 220-1, . . . , 220-R comprises one physical page of memory cells. However, embodiments of the present disclosure are not so limited. For instance, in a number of embodiments, each row can comprise multiple physical pages of memory cells (e.g., one or more even pages of memory cells coupled to even-numbered bit lines, and one or more odd pages of memory cells coupled to odd numbered bit lines). Additionally, for embodiments including multilevel cells, a physical page of memory cells can store multiple pages (e.g., logical pages) of data (e.g., an upper page of data and a lower page of data, with each cell in a physical page storing one or more bits towards an upper page of data and one or more bits towards a lower page of data).

In a number of embodiments of the present disclosure, and as shown in FIG. 2, a page of memory cells can comprise a number of physical sectors 222-0, 222-1, . . . , 222-S. Each physical sector 222-0, 222-1, . . . , 222-S of cells can store a number of logical sectors of data. For example, a logical sector stored in a particular physical sector can correspond to particular logical groups of data stored in the particular physical sector. Additionally, each logical sector of data can correspond to a portion of a particular page of data. As an example, a first logical sector of data stored in a particular physical sector can correspond to a logical sector corresponding to a first page of data, and a second logical sector of data stored in the particular physical sector can correspond to a second page of data. Each physical sector 222-0, 222-1, . . . , 222-S, can store system and/or user data, and can include overhead data, such as error correction code (ECC) information and logical block address (LBA) information.

Logical block addressing is a scheme that can be used by a host for identifying a logical sector of data. For example, each logical sector can correspond to a unique logical block address (LBA). Additionally, an LBA may also correspond to a physical address. A logical sector of data can be a number of bytes of data (e.g., 256 bytes, 512 bytes, or 1,024 bytes). However, embodiments are not limited to these examples.

It is noted that other configurations for the physical blocks 216-0, 216-1, . . . , 216-B, rows 220-0, 220-1, . . . , 220-R, sectors 222-0, 222-1, . . . , 222-S, and pages are possible. For example, rows 220-0, 220-1, . . . , 220-R of physical blocks 216-0, 216-1, . . . , 216-B can each store data corresponding to a single logical sector which can include, for example, more or less than 512 bytes of data.

Figure 3:
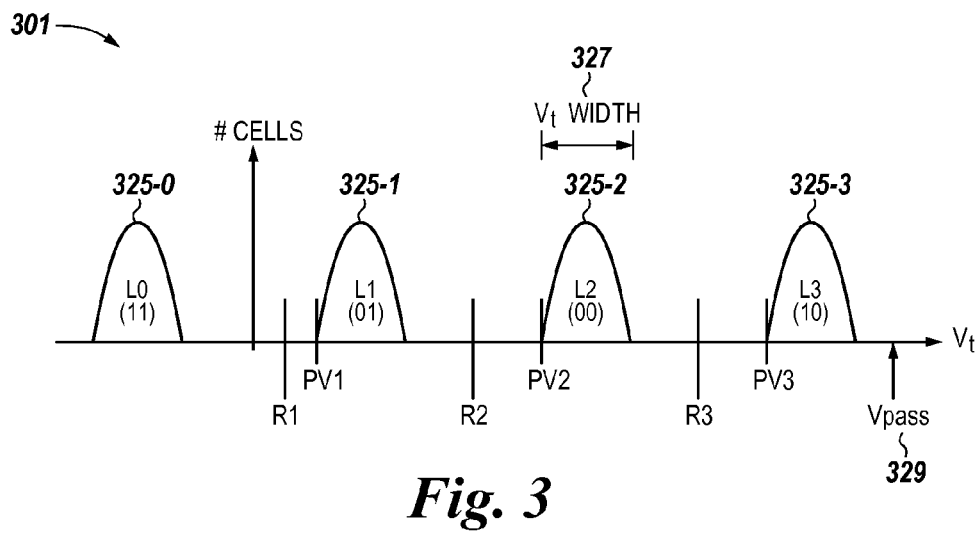
FIG. 3 illustrates a diagram of a number of threshold voltage distributions and sensing voltages in accordance with a number of embodiments of the present disclosure.

FIG. 3 illustrates a diagram 301 of a number of threshold voltage distributions and sensing voltages in accordance with a number of embodiments of the present disclosure. The example shown in FIG. 3 can represent, for example, memory cells 111-1, . . . , 111-N previously described in connection with FIG. 1. The example shown in FIG. 3 represents two-bit (e.g., four-state) memory cells. However, embodiments of the present disclosure are not limited to this example of two-bit memory cells, as will be appreciated by one of ordinary skill in the art.

As shown in FIG. 3, threshold voltage (Vt) distributions 325-0, 325-1, 225-2, and 325-3 represent four target states (e.g., L0, L1, L2, and L3, respectively) to which the memory cells can be programmed. In the example illustrated in FIG. 3, Vt distribution 325-3 can be referred to as a maximum Vt, e.g., "$Vt_{max}$", to which a cell can be programmed because it is the range including the Vt with the largest magnitude. In operation, the memory cells in a selected block can be erased together such that they have a Vt level within Vt distribution 325-0 prior to being programmed. As such, distribution 325-0 can be referred to as an erased state and can represent a particular stored data state (target state L0), e.g., stored data such as binary "11". Target state L1 can correspond to data 01, target state L2 can correspond to data 00, and target state L3 can correspond to data 10. However, embodiments are not limited to these data assignments.

Vt distributions 325-0, 325-1, 325-2, and 325-3 can represent a number of memory cells that are programmed to the corresponding target states, where the height of a Vt distribution curve indicates a number of cells programmed to a particular voltage within the Vt distribution, on average. The width 327 of the Vt distribution curve indicates the range of voltages that represent a particular target state (e.g., the width of the Vt distribution curve 325-2 for L2 represents the range of voltages that correspond to data 00).

A number of sensing voltages are illustrated in FIG. 3. Such sensing voltages can include program verify voltages and/or read voltages, among other sensing voltages. For example, program verify voltages PV1, PV2, and PV3 are illustrated, as well as read voltages R1, R2, and R3. A program verify operation can be performed after one or more programming pulses to help determine whether a memory cell has been programmed within a desired Vt range to help prevent the memory cell from receiving further programming pulses (e.g., "over programming" the cell). For instance, memory cells to be programmed to the L1 target state can be program verified with a voltage PV1. Similarly, program verify voltage PV2 can be used with cells to be programmed to L2 and PV3 can be used with cells to be programmed to L3.

In the example illustrated in FIG. 3, read voltage levels R1, R2, and R3 represent sensing voltages (e.g., read voltages) that can be used to distinguish between states L0, L1, L2, and L3 during a sense operation. In a sense operation performed on a selected memory cell in a NAND string, the unselected memory cells of the string can be biased with a pass voltage "Vpass" 329 so as to be in a conducting state.

The Vt of a memory cell can change (e.g., shift) over time due to a number of mechanisms. For example, the charge storage structure (e.g., floating gate) of the memory cell may lose charge over time. Such charge loss can cause the Vt of the cell to change (e.g., decrease). Additionally, as the memory cell undergoes program and/or sense operations over time, program disturb and/or read disturb mechanisms may cause the Vt of the cell to change (e.g., increase). Other mechanisms can also cause the Vt of the memory cell to change over time, as will be appreciated by one of ordinary skill in the art.

In some instances, such a Vt change can alter the state of the memory cell. For example, if the memory cell were programmed to target state L2 (e.g., data 00), charge loss could cause the Vt of the memory cell to decrease to a level less than R2, or possibly to a level within Vt 325-1 corresponding to state L1 (e.g., data 01).

Accordingly, such a Vt change can result in erroneous data being sensed during a sense operation performed on the memory cell using the sensing voltages illustrated in FIG. 3 (e.g., read voltages R1, R2 and R3, and/or program verify voltages PV1, PV2, and PV3). For example, performing a sense operation using the sensing voltages illustrated in FIG. 3 may result in a determination that the memory cell represents a state other than the target state to which the cell was programmed. For instance, a sense operation performed on a memory cell that was programmed to target state L2 and has undergone charge loss may determine that the cell represents state L1, if read voltage R2 is used in the sensing operation. That is, using read voltage R2 may result in a cell programmed to store data 00 being erroneously sensed as storing data 01.

As such, sensing voltages used during sense operations performed before the Vt change occurs (e.g., the read and/or program verify voltages illustrated in FIG. 3) may no longer provide accurate and/or reliable sensing of memory cells that have undergone a Vt change (e.g., charge loss). However, adjusting (e.g., changing) the sensing voltages (e.g., to sensing voltages other than those illustrated in FIG. 3) may track and/or compensate for such a Vt change, thereby providing accurate and/or reliable sensing of the memory cells that have undergone the Vt change, as will be further described herein.

Figure 4:
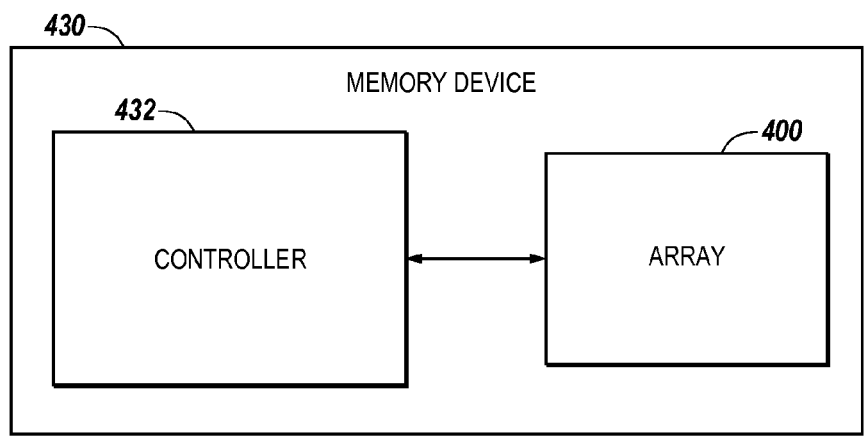
FIG. 4 illustrates a block diagram of an apparatus in the form of a memory device in accordance with a number of embodiments of the present disclosure.

FIG. 4 illustrates a block diagram of an apparatus in the form of a memory device 430 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example.

As shown in FIG. 4, memory device 430 includes a controller 432 coupled to a memory array 400. Memory array 400 can be, for example, memory array 100 and/or 200 previously described in connection with FIGS. 1 and 2, respectively. For instance, memory array 400 can include a number of groups of memory cells, such as a number of dies and/or blocks (e.g., physical blocks) of memory cells, among other physical groupings of memory cells, as previously described in connection with FIG. 2. Although one memory array is shown in FIG. 4, embodiments of the present disclosure are not so limited (e.g., memory device 430 can include more than one memory array coupled to controller 432).

Controller 432 can include, for example, control circuitry and/or logic (e.g., hardware and firmware). Controller 432 can be included on the same physical device (e.g., the same die) as memory array 400, or can be included on a separate physical device that is communicatively coupled to the physical device that includes memory array 400. In a number of embodiments, components of controller 432 can be spread across multiple physical devices (e.g., some components on the same die as the array, and some components on a different die, module, or board) as a distributed controller.

Controller 432 can track and/or compensate for Vt change in the memory cells of memory array 400 by continuously calibrating sensing voltages used to determine the state of the memory cells. For example, controller 432 can continuously monitor an error rate associated with sense operations performed on the memory cells of each of the number of memory cell groups in memory array 400, and continuously adjust the sensing (e.g., read) voltage used to determine the state of the memory cells of each respective group based, at least partially, on the error rate associated with the sense operations performed on the memory cells of that respective group. Controller 432 can then determine the state of (e.g., perform subsequent sense operations on) the memory cells of that respective group using the adjusted sensing voltage.

As used herein, an "error rate" can be, for example, a bit error rate (BER), and can refer to an amount of erroneous bits corresponding to an amount of data sensed from a memory (e.g., memory array 400) divided by the total amount of data sensed. For instance, the error rate associated with a sense operation can include the quantity (e.g., count) of bits corrected (e.g., flipped from 0 to 1 or from 1 to 0) during that sense operation.

Controller 432 can continuously monitor the error rate associated with sense operations performed on the memory cells of a memory cell group by, for example, monitoring the error rate associated with each sense operation performed on the memory cells of that group during operation (e.g., throughout the lifetime) of memory device 430 (e.g., memory array 400). These sense operations can be sense operations that are already being performed on the memory cells of memory array 400 (e.g., already occurring) during operation of memory device 430 (e.g., sense operations initiated by the user of memory device 430). Controller 432 can continuously adjust the sensing voltage used to determine the state of the memory cells of that group during operation (e.g., throughout the lifetime) of memory device 430 (e.g., memory array 400) based, at least partially, on the error rate. Controller 432 can perform this continuous monitoring and adjusting for each of the number of groups of memory cells in memory array 400.

As an example, controller 432 can determine an error rate (e.g., a current error rate) associated with each of a particular number (e.g., amount) of sense operations performed (e.g., currently performed) on the memory cells of a memory cell group, and sum the determined error rates. Controller 432 can compare the determined error rates (e.g., the sum of the determined error rates) with a previous error rate (e.g., a sum of previous error rates) associated with the particular number of sense operations previously performed on the memory cells of the group, and adjust the sensing voltage used to determine the state of the memory cells of the group based, at least partially, on the comparison. Controller 432 can determine and sum the error rates as part of an accumulation loop being continuously performed by controller 432, as will be further described herein (e.g., in connection with FIG. 5). Controller 432 can compare the determined error rates and adjust the sensing voltage as part of a correction loop being continuously performed by controller 432, as will be further described herein (e.g., in connection with FIG. 6).

The embodiment illustrated in FIG. 4 can include additional circuitry, logic, and/or components not illustrated so as not to obscure embodiments of the present disclosure. For example, memory device 430 can include address circuitry to latch address signals provided over I/O connectors through I/O circuitry. Address signals can be received and decoded by a row decoder and a column decoder, to access memory array 400.

Figure 5:
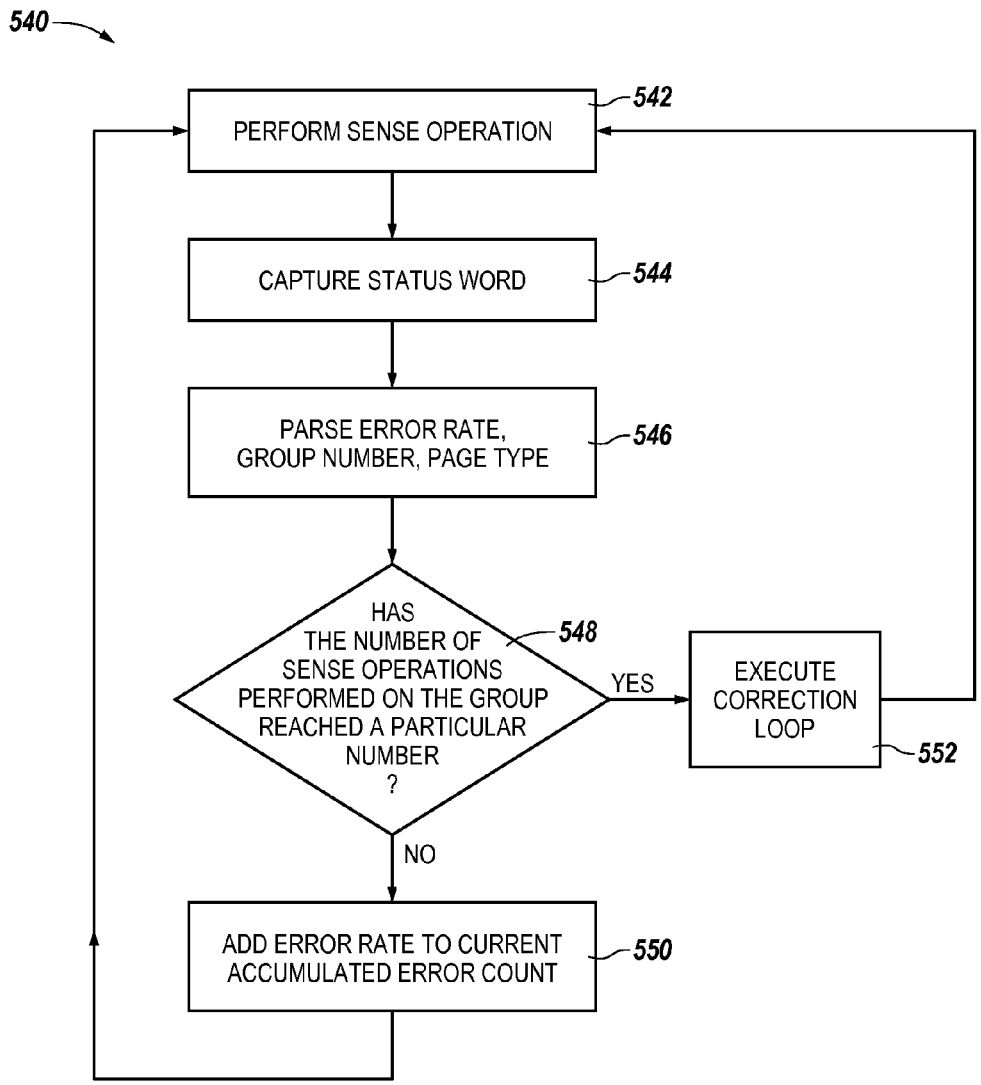
FIG. 5 illustrates a method for operating memory in accordance with a number of embodiments of the present disclosure.

FIG. 5 illustrates a method 540 for operating memory in accordance with a number of embodiments of the present disclosure. Method 540 can be performed by a controller such as, for example, controller 432 previously described in connection with FIG. 4. Method 540 can be an accumulation loop that can be used to continuously monitor an error rate associated with sense operations performed on the memory cells of each of a number of groups of memory cells in a memory.

At block 542, method 540 includes performing a sense operation on a group of memory cells. The group of memory cells can be, for example, a die or block of memory cells, as previously described herein. The sense operation can be one that is already being performed on the memory cells, as previously described herein.

At block 544, method 540 includes capturing a status word from (e.g., produced by) the sense operation (e.g., from the memory cells on which the sense operation is performed). The status word can include the error rate (e.g., BER) associated with the sense operation, an identification of (e.g., a group number identifying) the memory cells on which the sense operation is performed as memory cells of that group, and an identification of the (e.g. a page type identifying the) page type (e.g., upper, lower, odd, even) of the memory cells on which the sense operation is performed. At block 546, method 540 includes parsing the error rate, group number, and page type from the status word.

At block 548, method 540 includes determining whether the number of sense operations performed on the group of memory cells has reached a particular number (e.g., amount). This determination can be made by, for example, a counter in the controller (e.g., in hardware of the controller) that counts the number of times a status word has been captured for that group. The particular number can be, for example, 100 (e.g., 100 sense operations). However, embodiments of the present disclosure are not so limited.

In the example shown in FIG. 5, if it is determined that the number of sense operations performed on the group of memory cells has not reached the particular number, then the error rate associated with the sense operation is added to a current accumulated error count associated with the group at block 550. The current accumulated error count can be stored by the controller (e.g., in a table in a memory of the controller). Method 540 then returns to block 542.

If it is determined that the number of sense operations performed on the group of memory cells has reached the particular number, then a correction loop can be executed at block 552. The correction loop can adjust the sensing voltage used to determine the state of the memory cells of the group, and will be further described herein (e.g., in connection with FIG. 6). Method 540 then returns to block 542.

Figure 6:
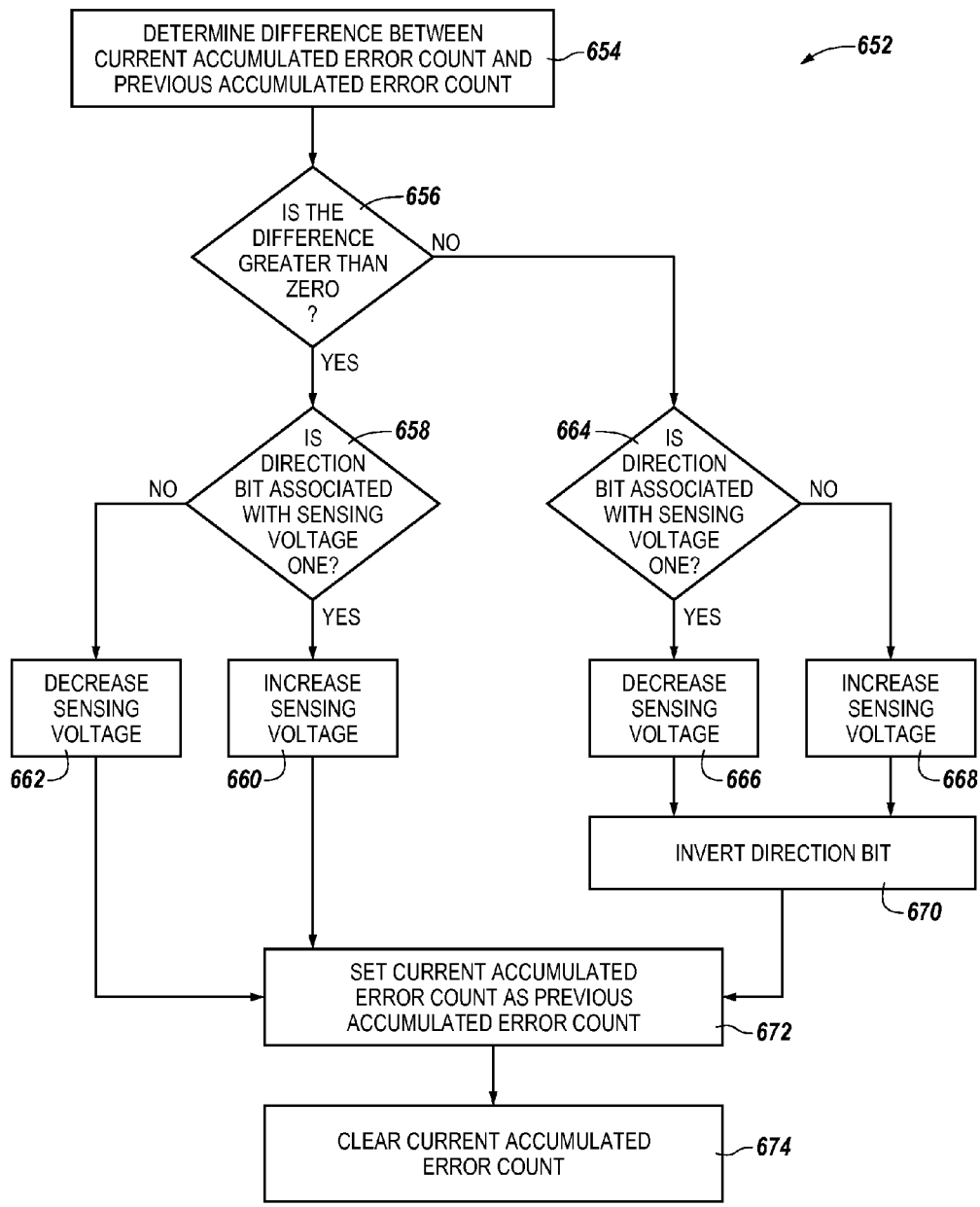
FIG. 6 illustrates a method for operating memory in accordance with a number of embodiments of the present disclosure.

FIG. 6 illustrates a method 652 for operating memory in accordance with a number of embodiments of the present disclosure. Method 652 can be performed by a controller such as, for example, controller 432 previously described in connection with FIG. 4. Method 652 can be a correction loop that can be used to continuously adjust the sensing (e.g., read) voltage used to determine the state of a group of memory cells based, at least partially, on the error rate associated with sense operations performed on the memory cells of the group. For example, method 652 can correspond to block 552 previously described in connection with FIG. 5.

At block 654, method 652 includes determining the difference between the current accumulated error count associated with the group of memory cells and a previous accumulated error count associated with the group (e.g., subtracting the current accumulated error count from the previous accumulated error count). The previous accumulated error count associated with the group can be an error count accumulated during a previous execution of accumulation loop 540 (e.g., the last error count to be accumulated before the current error count was accumulated), and can be stored by the controller (e.g., in a table in a memory of the controller).

In the example shown in FIG. 6, if it is determined that the difference between the current and previous accumulated error counts associated with the group is greater than a threshold deviation (e.g., zero), then it is determined whether a direction bit associated with the sensing voltage used to determine the state of the memory cells of the group is one (1) at block 658. If it is determined that the direction bit associated with the sensing voltage is one (1), the sensing voltage is increased (e.g., by one count and/or incremental step) at block 660, and method 652 proceeds to block 672. If it is determined that the direction bit associated with the sensing voltage is not one (1) (e.g., is zero (0)), the sensing voltage is decreased (e.g., by one count and/or incremental step) at block 662, and method 652 proceeds to block 672. That is, determining whether the direction bit is one (1) (e.g., tracking the direction bit) can indicate whether to increase or decrease the sensing voltage (e.g., the direction in which to move the sensing voltage).

If it is determined that the difference between the current and previous accumulated error counts associated with the group is not greater than the threshold deviation (e.g., is less than zero), then it is determined whether the direction bit associated with the sensing voltage used to determine the state of the memory cells of the group is one (1) at block 664. If it is determined that the direction bit associated with the sensing voltage is one (1), the sensing voltage is decreased (e.g., by one count and/or incremental step) at block 666, and method 652 proceeds to block 670. If it is determined that the direction bit associated with the sensing voltage is not one (1) (e.g., is zero (0)), the sensing voltage is increased (e.g., by one count and/or incremental step) at block 668, and method 652 proceeds to block 670. That is, determining whether the direction bit is one (1) (e.g., tracking the direction bit) can indicate whether to increase or decrease the sensing voltage (e.g., the direction in which to move the sensing voltage).

At block 670, method 652 includes inverting the direction bit associated with the sensing voltage (e.g., changing the direction bit from one (1) to zero (0) or from zero (0) to one (1)). Method 652 then proceeds to block 672.

At block 672, method 652 includes setting the current accumulated error count as the previous accumulated error count (e.g., the current accumulated error count becomes the previous accumulated error count), and at block 674, method 652 includes clearing the current accumulated error count (e.g., the current accumulated error count is set to zero). A new accumulation loop for the group can then be executed, as previously described in connection with FIG. 5.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating memory, comprising:
   monitoring a current error rate associated with a number of sense operations currently performed on a group of memory cells;
   comparing the current error rate with a previous error rate associated with a number of sense operations previously performed on the memory cells of the group, wherein comparing the current error rate with the previous error rate includes determining a difference between the current error rate and the previous error rate; and
   adjusting a sensing voltage used to determine a state of the memory cells of the group based, at least partially, on whether the difference between the current error rate and the previous error rate is greater than a threshold deviation.

2. The method of claim 1, wherein the current error rate associated with the number of sense operations currently performed on the group of memory cells is a sum of current error rates associated with the number of sense operations currently performed on the memory cells of the group.

3. The method of claim 1, wherein the previous error rate associated with the number of sense operations previously performed on the memory cells of the group is a sum of previous error rates associated with the number of sense operations previously performed on the memory cells of the group.

4. The method of claim 1, wherein the number of currently performed sense operations is the same as the number of previously performed sense operations.

5. The method of claim 1, wherein the method includes adjusting the sensing voltage used to determine the state of the memory cells of the group upon the number of sense operation currently performed on the group of memory cells reaching a particular number.

6. An apparatus, comprising:
   a memory comprising a number of groups of memory cells; and
   a controller coupled to the memory and configured to:
   continuously monitor an error rate associated with sense operations performed on the memory cells of each of the number of groups by continuously performing an accumulation loop that monitors the error rate associated with each sense operation performed on the memory cells of each respective group during operation of the memory; and
   continuously adjust a sensing voltage used to determine a state of the memory cells of each respective group based, at least partially, on the error rate associated with the sense operations performed on the memory cells of that respective group.

7. The apparatus of claim 6, wherein the controller is configured to continuously adjust the sensing voltage used to determine the state of the memory cells of each respective group during the operation of the memory.

8. The apparatus of claim 6, wherein the controller is configured to continuously monitor the error rate associated with sense operations performed on the memory cells of each of the number of groups by monitoring the error rate associated with each sense operation performed on the memory cells of each respective group throughout a lifetime of the memory.

9. The apparatus of claim 6, wherein the sense operations performed on the memory cells of each of the number of groups are sense operations initiated by a user of the apparatus.

10. The apparatus of claim 6, wherein the controller is configured to continuously adjust the sensing voltage used to determine the state of the memory cells of each respective group by continuously performing a correction loop during the operation of the memory.

11. The apparatus of claim 6, wherein the controller is configured to determine the state of the memory cells of each respective group using the adjusted sensing voltage for that respective group.

12. The apparatus of claim 6, wherein the number of groups of memory cells include:
   a number of dies of memory cells; and
   a number of blocks of memory cells.

13. A method for operating memory, comprising:
   continuously, during operation of the memory, monitoring an error rate associated with sense operations performed on a group of memory cells; and
   continuously, during the operation of the memory, adjusting a sensing voltage used to determine a state of the memory cells of the group based, at least partially, on the error rate by continuously performing a correction loop during the operation of the memory.

14. The method of claim 13, wherein the method includes continuously, during the operation of the memory, compensating for threshold voltage change in the memory cells of the group by continuously adjusting the sensing voltage used to determine the state of the memory cells of the group.

15. The method of claim 13, wherein the method includes:
   continuously, throughout a lifetime of the memory, monitoring the error rate associated with sense operations performed on the group of memory cells; and continuously, throughout the lifetime of the memory, adjusting the sensing voltage used to determine a state of the memory cells of the group based, at least partially, on the error rate.

16. The method of claim 13, wherein the error rate associated with the sense operations performed on the group of memory cells includes a quantity of bits corrected during the sense operations.

17. The method of claim 13, wherein the method includes:
continuously monitoring the error rate associated with the sense operations performed on the group of memory cells using a controller; and
continuously adjusting the sensing voltage used to determine the state of the memory cells of the group using a controller.

* * * * *